United States Patent
Suto et al.

(10) Patent No.: US 7,272,527 B1
(45) Date of Patent: Sep. 18, 2007

(54) METHOD OF TEST OF CLOCK GENERATION CIRCUIT IN ELECTRONIC DEVICE, AND ELECTRONIC DEVICE

(75) Inventors: Hiroyuki Suto, Kawasaki (JP);
Masahide Kanegae, Kawasaki (JP);
Osamu Kawashima, Kawasaki (JP);
Michihiko Umeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/487,504

(22) Filed: Jul. 17, 2006

(30) Foreign Application Priority Data

Mar. 30, 2006 (JP) .............................. 2006-092919

(51) Int. Cl.
*G01M 19/00* (2006.01)
(52) U.S. Cl. ...................... 702/108; 702/182; 327/105; 327/160; 324/76.19; 324/76.52
(58) Field of Classification Search ................. 702/75, 702/106, 108, 182; 327/105, 141, 160, 291; 714/724, 731; 324/76.39, 76.41, 76.19, 76.52, 324/76.77, 763, 765
See application file for complete search history.

(56) References Cited

U.S. PATENT DOCUMENTS

| | | | | |
|---|---|---|---|---|
| 5,598,447 A | * | 1/1997 | Usui | ......................... 375/376 |
| 6,380,774 B2 | * | 4/2002 | Saeki | ......................... 327/119 |
| 6,583,655 B2 | * | 6/2003 | Takahashi et al. | .......... 327/160 |
| 6,842,061 B2 | * | 1/2005 | Suda et al. | .................. 327/291 |
| 6,859,026 B2 | * | 2/2005 | Hsi et al. | .................. 324/76.52 |
| 2003/0038659 A1 | * | 2/2003 | Takahashi et al. | .......... 327/141 |
| 2004/0122620 A1 | * | 6/2004 | Doi et al. | ................... 702/182 |
| 2004/0155642 A1 | * | 8/2004 | Hsi et al. | ................. 324/76.19 |
| 2004/0207436 A1 | * | 10/2004 | Suda et al. | .................. 327/105 |

FOREIGN PATENT DOCUMENTS

| | | |
|---|---|---|
| JP | 64-77305 | 3/1989 |
| JP | 9-246868 | 9/1997 |

* cited by examiner

*Primary Examiner*—Carol S. W. Tsai
(74) *Attorney, Agent, or Firm*—Kratz, Quintos & Hanson, LLP

(57) ABSTRACT

In an electronic device having an interface circuit which operates using a fast clock source, frequency deviation of the clock source is inspected in the mounted state. The clock pulses of the fast clock source are counted in synchronization with an electronic device serving as reference, and the result is checked; or, alignment data of transfer data and overflow/underflow of the FIFO buffer are utilized; or, the count values of an internal counter and a fast clock counter are utilized, to check for frequency deviation of the fast clock source. In the state of being mounted in the device, tests can be performed of the clock sources of all units.

16 Claims, 8 Drawing Sheets

FIG. 7
CASE IN WHICH INTERNAL GENERATED CLOCK IS SLOWER THAN RECOVERED CLOCK
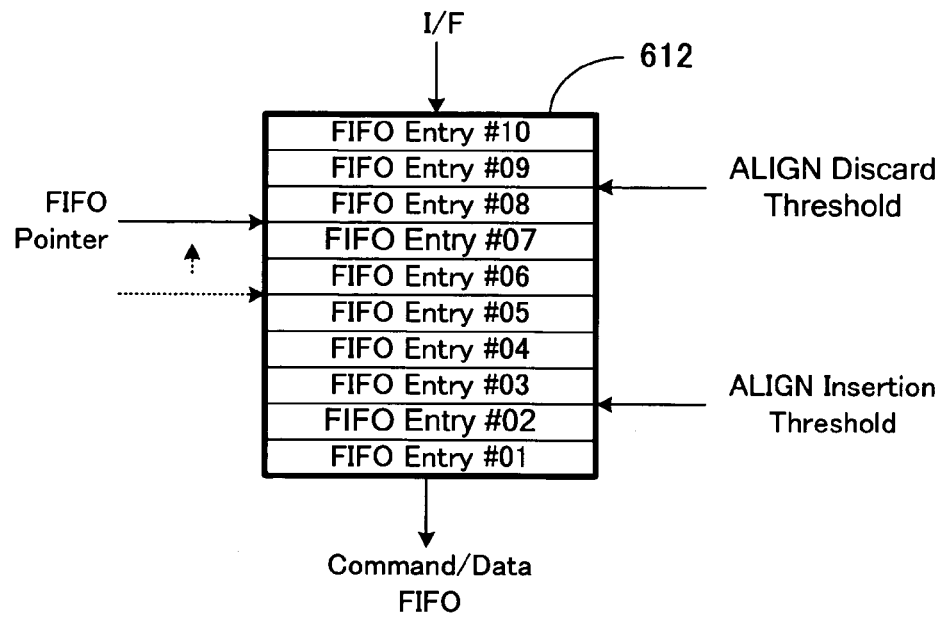
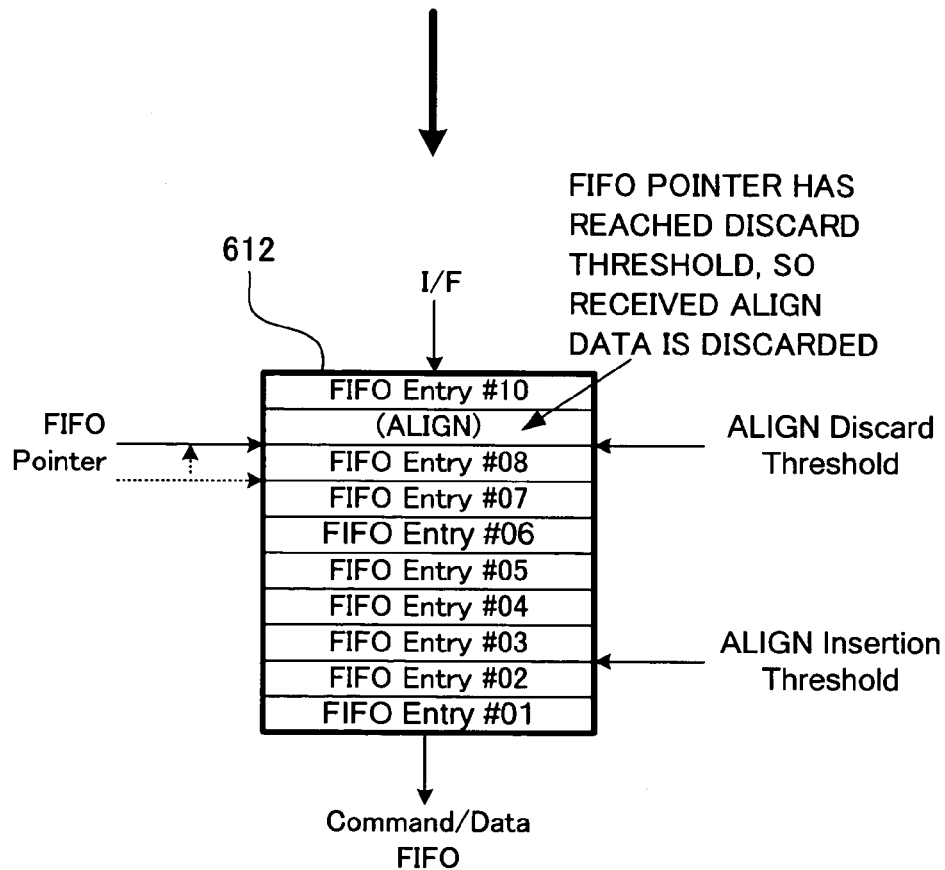

FIG. 8   CASE IN WHICH INTERNAL GENERATED
CLOCK IS FASTER THAN RECOVERED CLOCK

METHOD OF TEST OF CLOCK GENERATION CIRCUIT IN ELECTRONIC DEVICE, AND ELECTRONIC DEVICE

CROSS-REFERENCE TO RELATED APPLICATIONS

This application is based upon and claims the benefit of priority from the prior Japanese Patent Application No. 2006-092919, filed on Mar. 30, 2006, the entire contents of which are incorporated herein by reference.

BACKGROUND OF THE INVENTION

1. Field of the Invention

The present invention relates to a method of test of a clock generation circuit in an electronic device having an external interface and to an electronic device, and in particular relates to a clock generation circuit testing method for an electronic device having a clock generation circuit for an interface faster than the internal clock of the electronic device, and to an electronic device.

2. Description of the Related Art

Magnetic disk devices and other peripheral devices communicate with a host or similar through a prescribed interface. With demands for faster processing in recent years, there have been strong demands for faster interfaces. For example, in high-speed serial transfer over Fibre Channel, SATA (Serial AT Attachment), PCI Express and similar, transfer rates reach 2 GB to 4 GB per second.

In order to accommodate such high-speed interfaces, interface circuits are provided in existing peripheral devices. On the other hand, existing peripheral devices are designed to operate at a prescribed clock frequency, and have an internal clock source. As a result, when equipped with a high-speed interface circuit, it is necessary that the device also be equipped with a high-speed clock source to support this interface.

For example, in an electronic device the internal clock source of which is 40 MHz, a clock source of 75 MHz, 106.25 MHz, or 150 MHz is installed according to the interface speed. Quartz oscillators are used as such a clock source (see for example Japanese Patent Laid-open No. 64-077305).

In such quartz oscillators, depending on the interface, it is required that the oscillation frequency be within 0.01% (for example ±100 ppm) of the specification; but electronic equipment manufacturers install oscillators in peripheral devices and other electronic devices without performing checks of all the clock sources for which a high-precision oscillation frequency is required, opting instead to trust the expertise of the supplier of the clock source. There have been proposals of methods to diagnose problems with a quartz oscillator, when mounted on a printed circuit board, as originating with either the oscillator or the oscillation circuit (see for example Japanese Patent Laid-open No. 9-246868).

However, even among clock sources such as these, the existence of units which do not satisfy specifications cannot be denied. On the part of electronic device manufacturers, tests of individual purchased clock sources would be sufficient, but the installation of dedicated testing tools and equipment by electronic device manufacturers would be a cause of increased costs. Tests of clock source units after mounting on printed circuit boards similarly result in cost increases.

For this reason, after installation in an electronic device (on a printed circuit board), it has not been possible to exclude problematic clock sources until actual faults occur in various tests of the electronic device itself. Moreover, even if problems do not occur in various device tests, there is the possibility that faults may occur in a printed circuit board equipped with a clock source which does not satisfy specifications after the electronic device has been supplied to the market.

SUMMARY OF THE INVENTION

Hence an object of this invention is to provide a method for testing the clock generation circuit in an electronic device, and an electronic device, to perform tests of a clock source for an interface, in the mounted state on a printed circuit board, without using specialized tools or equipment.

A further object of the invention is to provide a clock generation circuit testing method for an electronic device, and an electronic device, to perform tests of a clock source for an interface, in the mounted state on a printed circuit board, in a testing process.

A further object of the invention is to provide a clock generation circuit testing method for an electronic device, and an electronic device, to perform tests of a clock source for an interface, in the mounted state on a printed circuit board, without leading to cost increases.

A further object of the invention is to provide a clock generation circuit testing method for an electronic device, and an electronic device, to perform tests of a clock source for an interface, in the mounted state on a printed circuit board, even after being supplied to the market.

In order to attain these objects, a testing method of this invention is a method of testing a clock generation circuit in an electronic device having an interface circuit which operates using a clock of a comparatively fast clock source, and has the steps of connecting an electronic device to be measured to an electronic device which serves as reference using the interface circuit, synchronizing the electronic device to be measured with the reference electronic device, and counting clock pulses of the clock source in use of counters in the electronic device to be measured and in the reference electronic device; halting, after a prescribed time has elapsed, the counting by the counters of the electronic device to be measured and the reference electronic device; transmitting the count value of the counter of the electronic device to be measured from the electronic device to be measured to the reference electronic device; and comparing the transmitted count value with the count value of the counter of the reference electronic device in the reference electronic device, and testing for deviations in the frequency of the clock source in the electronic device to be measured.

Further, another testing method of this invention is a method of testing a clock generation circuit in an electronic device having an interface circuit which operates using a clock of a comparatively fast clock source, and has the steps of; receiving transferred data into which is inserted alignment data in prescribed transfer units from an electronic device connected by the interface circuit; storing the received transferred data in a FIFO buffer using a clock synchronized with the transfer and of performing output using the clock of the clock source, as well as performing insertion and deletion of the alignment data in the FIFO buffer to prevent overflow and underflow of the FIFO buffer; and modifying at least one of the alignment insertion interval of the transferred data and the conditions for detection of overflow or underflow, judging whether overflow or underflow is detected, and testing for deviations in frequency of the clock source of the electronic device.

Further, the other testing method of this invention is a method of testing a clock generation circuit in an electronic device having an interface circuit which operates using a clock of a comparatively fast clock source, and has the steps of; starting, in use of an internal circuit which operates using a comparatively slow clock source, counting by a counter which counts clock pulses of the comparatively fast clock source and counting by an internal counter which counts the clock pulses of the comparatively slow clock source; detecting that the internal counter has reached a prescribed value, and of reading and outputting the count value of the counter; and inspecting, in use of the count value, for frequency deviation of the comparatively fast clock source of the electronic device.

Further, in this invention it is preferable that the counting step has a step of transmitting a measurement start message from the reference electronic device to the electronic device to be measured, a step of responding with a measurement start message from the electronic device to be measured to the reference electronic device, and a step of counting the clock pulses of the clock sources by the counters of the electronic device to be measured and of the reference electronic device.

Further, in this invention it is preferable that the test step has a step of comparing the FIFO pointer of the FIFO buffer with a prescribed threshold, and of judging whether overflow or underflow has been detected.

Further, in this invention it is preferable that the test step has a step of judging whether the count value is within a range of the specification value corresponding to a prescribed frequency deviation.

Further, an electronic device of this invention has a comparatively fast first clock source, an interface circuit which operates using the clock of the first clock source, a comparatively slow second clock source, and an internal circuit which is connected to the interface circuit and which operates in use of the clock of the second clock source. And the internal circuit counts in use of a counter the clock pulses of the first clock source in synchronization with an electronic device which is connected to the interface circuit and which serves as reference, transmits the count value of the counter to the reference electronic device after a prescribed amount of time has elapsed, and inspects for frequency deviation of the first clock source in the reference electronic device.

Further, another electronic device of this invention has a comparatively fast first clock source, an interface circuit which operates using the clock of the first clock source, a comparatively slow second clock source, and an internal circuit, connected to the interface circuit, which operates using the clock of the second clock source. And the internal circuit has a reception circuit which receives transfer data into which alignment data has been inserted in prescribed transfer units, a FIFO buffer which stores the received transfer data using the clock synchronized with the transfer, and outputs the data with the clock of the clock source, and a FIFO control circuit which performs insertion and deletion of alignment data into and from the FIFO buffer to prevent FIFO buffer overflow and underflow. Further, the internal circuit receives the transfer data with the interval of alignment data insertion changed, or changes the detection conditions of overflow or underflow, judges whether overflow or underflow has been detected, and inspects for frequency deviation of the first clock source.

Further, the other electronic device of this invention has a comparatively fast first clock source, an interface circuit which operates using the clock of the first clock source, and comparatively slow second clock source, and an internal circuit, connected to the interface circuit, which operates using the clock of the second clock source. And the interface circuit has a counter which counts the clock pulses of the first clock source; and the internal clock circuit starts counting by the counter and by an internal counter which counts the clock pulses of the second clock source, detects the fact that the internal counter has reached a prescribed value, reads out the count value of the counter, and uses the count values to inspect for frequency deviation of the first clock source.

In this invention, it is preferable that the internal circuit receives a measurement start message transmitted from the reference electronic device, respond to the reference electronic device with a measurement start message, and use the counter to count the clock pulses of the first clock source.

In this invention, it is preferable that the internal circuit includes a disk drive control circuit.

In this invention, it is preferable that the FIFO control circuit compares the FIFO pointer of the FIFO buffer and a prescribed threshold value, and detects the presence of overflow or underflow.

In this invention, high-speed clock pulses are counted in synchronization with a reference electronic device, and the result is checked, or, alignment of transferred data and the overflow/underflow of a FIFO buffer is utilized, or, the count values of an internal counter and the counter of a fast clock are utilized, to check for frequency deviation of the high-speed clock source; hence all clock sources can be inspected in the state of being mounted in a device.

BRIEF DESCRIPTION OF THE DRAWINGS

FIG. 7 explains operation during overflow of the FIFO buffer of FIG. 4;

DESCRIPTION OF THE PREFERRED EMBODIMENTS

Below, embodiments of the invention are explained, in the order of an electronic device, a first embodiment of a method of clock generation circuit test, a second embodiment of a method of clock generation circuit test, a third embodiment of a method of clock generation circuit test, and other embodiments. However, this invention is not limited to these embodiments.

Configuration of an Electronic Device

Figure 1:
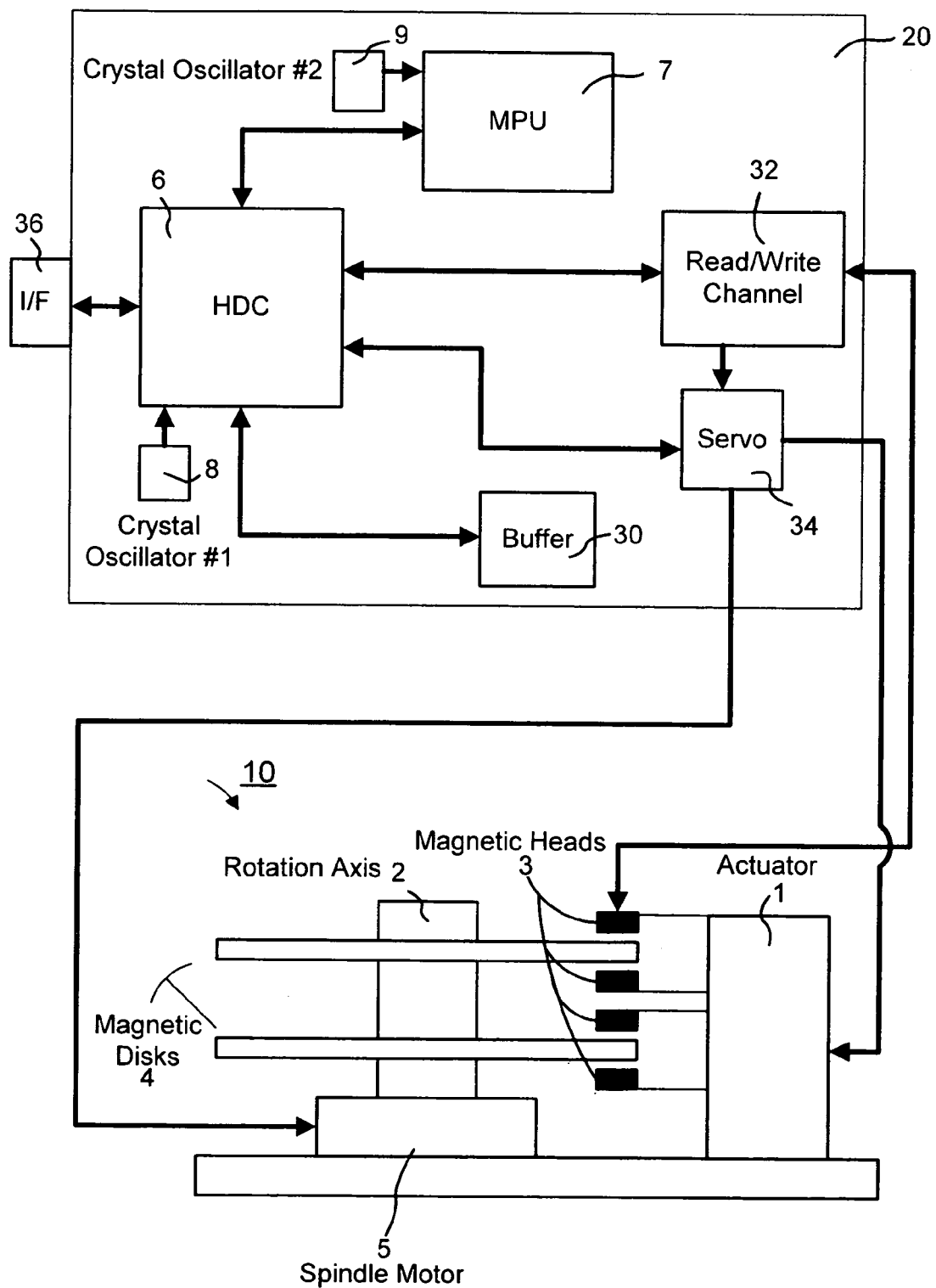
FIG. 1 shows the configuration of the electronic device of one embodiment of the invention.
Figure 2:
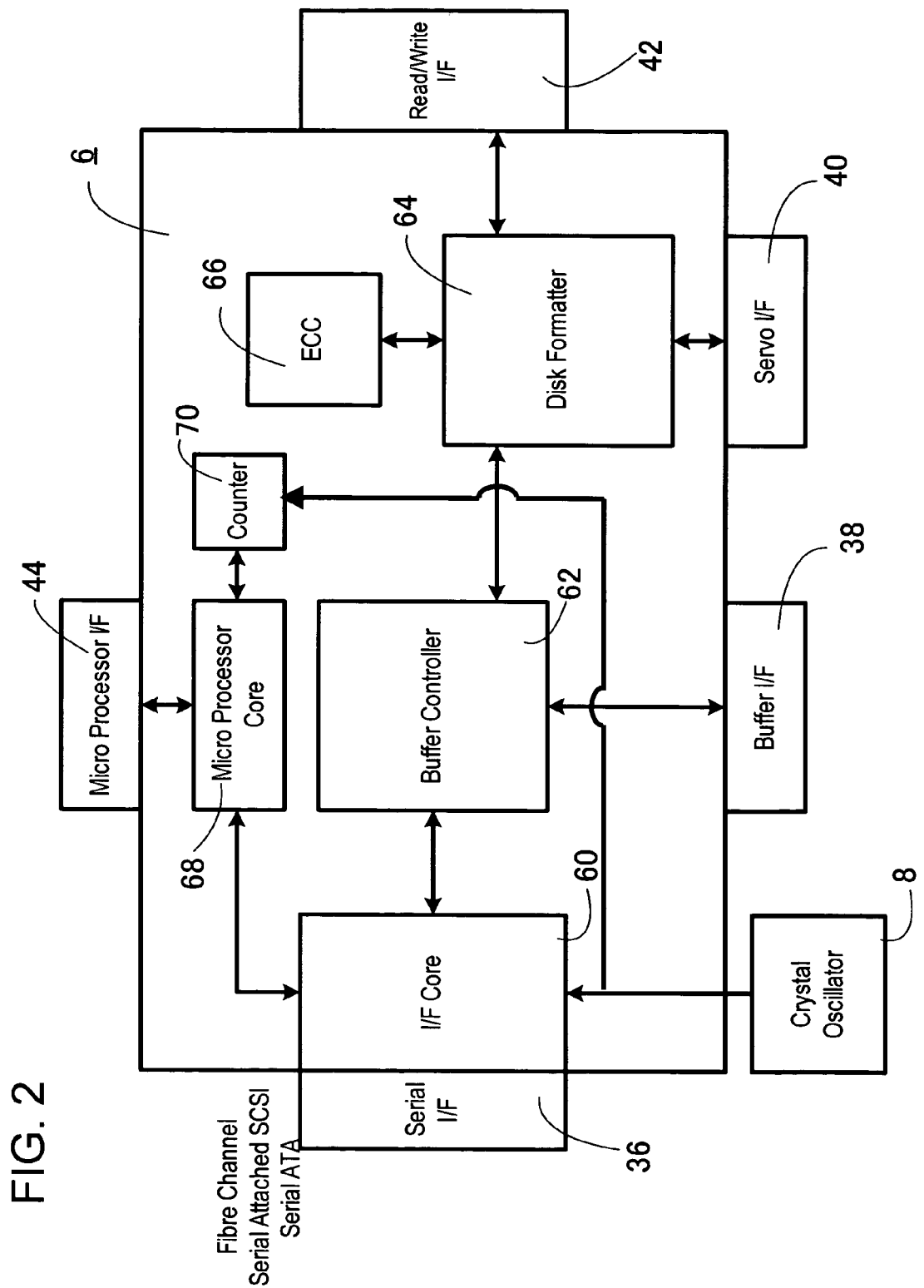
FIG. 2 shows the configuration of the hard disk controller of FIG. 1.

FIG. 1 shows the configuration of the electronic device of one embodiment of the invention, and FIG. 2 shows the configuration of the hard disk controller in FIG. 1. FIG. 1 shows a magnetic disk device as an example of an electronic device.

As shown in FIG. 1, in the magnetic disk drive mechanism 10, magnetic disks 4 which are magnetic recording media are provided on a rotation axis 2 of a spindle motor 5. The spindle motor 5 rotates the magnetic disks 4. An actuator (VCM) 1 has magnetic heads 3 on suspension tips, and moves the magnetic heads 3 in the radial direction of the magnetic disks 4.

The actuator 1 includes a voice coil motor (VCM) which rotates about a rotation axis. In the drawing, the magnetic disk device is equipped with two magnetic disks 4, and four magnetic heads 3 are driven simultaneously by the same actuator 1.

The magnetic heads 3 has a read element and a write element. The magnetic heads 3 are configured by laminating, on a slider, the read element comprising a magnetoresistive (MR) element, on top of which is stacked the write element comprising a write coil.

On a control print board (control circuit portion) 20 of the magnetic disk drive mechanism 10 are provided a hard disk controller 6, MPU 7, clock sources 8 and 9, a buffer circuit 30, a read/write channel circuit 32, and a servo circuit 34.

The read/write (R/W) channel circuit 32 controls reading and writing by the magnetic heads 3, supplies write signals to the magnetic heads 3, receives read signals from the magnetic heads 3, and performs demodulation. The servo circuit 34 has a spindle motor driving circuit which drives the spindle motor 5, and a position control circuit which receives servo signals in read signals from the read/write channel circuit 32, detects the current position, and controls driving of the voice coil motor (VCM) 1 according to position errors with respect to the target position.

As explained in FIG. 2, the hard disk controller (HDC) 6 communicates with the host via the interface 36, and uses the sector number of the servo signal as reference to judge the position within one circumference and perform data recording and reading. The buffer random access memory (RAM) 30 temporarily stores read data and write data. The HDC 6 communicates with the host using the SATA (Serial ATA), SCSI (Small Computer System Interface), or other interface 36.

The microcontroller (MPU) 7 analyzes commands from the HDC 6, and performs various processing via the HDC 6. For this purpose, the MPU 7 has read-only memory (ROM) which stores various programs, and random access memory (RAM).

Servo signals (position signals) are positioned at equal intervals in the circumferential direction on each track of the magnetic disk 4, from the outer to the inner circumferences. Each track comprises a plurality of sectors, and position signals comprise servo marks, track numbers in Gray code, an index, and offset information (servo burst) PosA, PosB, PosC, PosD. This magnetic disk drive mechanism 10 has a plurality of magnetic disks 4; these are stacked on the single spindle motor 5 and rotated in a fixed direction.

As shown in FIG. 1, the first clock source 8 comprises a fast clock source, which supplies a clock to the hard disk controller 6. For example, a 75 MHz quartz oscillator may be provided, according to the interface speed. The second clock source 9 comprises a slow clock source, and supplies a clock to the MPU 7, read/write channel circuit 32, and similar. For example, a 40 MHz quartz oscillator may be provided, according to the processing speed of the MPU 7.

FIG. 2 is a block diagram of the hard disk controller 6 in FIG. 1. As shown in FIG. 2, the hard disk controller 6 has an interface circuit (IF core) 60 connected to the serial interface 36, a buffer controller 62 connected to the interface circuit 60, a buffer interface portion 38 connected to the buffer controller 62 and which serves as the interface to the buffer 30, a disk formatter 64 connected to the buffer controller 62, and a servo interface portion 40 connected to the disk formatter 64 and which serves as the interface to the servo circuit 34.

The hard disk controller 6 also has an ECC circuit 66 connected to the disk formatter 64 and which creates and performs checks of ECCs (Error Correction Codes), a read/write interface portion 42 connected to the disk formatter 64 which serves as the interface to the read/write channel circuit 32, a microprocessor core circuit 68 connected to the interface circuit 60 and which controls exchanges of commands and data with the MPU 7, in synchronization with operation of the interface circuit 60, a microprocessor interface portion 44 connected to the microprocessor core circuit 68 which serves as the interface with the MPU 7, and a counter 70 connected to the microprocessor core circuit 68 which counts clock pulses.

In this hard disk controller 6, the interface circuit 60 operates using the clock of the fast clock source 8, and performs synchronization of frame data from the high-speed interface 36, conversion between serial data and parallel data, and similar. The clock of the fast clock source 8 is input to the counter 68, and the counter 68 counts the clock pulses.

The circuits 62, 64, 66, 68, 70 other than the interface circuit 60 operate using the clock of the slow clock source 9 in FIG. 1. In this way, in the interface circuit corresponding to the fast interface (here, the hard disk controller), there exist portions which operate using the slow clock necessary for internal operation, and portions which are directly related to the fast interface and operate using the fast clock. In this embodiment, the fast clock source 8 and circuits 60 to 70 are mounted on the control print board 20, and with the print board in the completed state, the performance of the fast clock source 8 is inspected.

First Embodiment of a Method of Clock Generation Circuit Test

Figure 3:
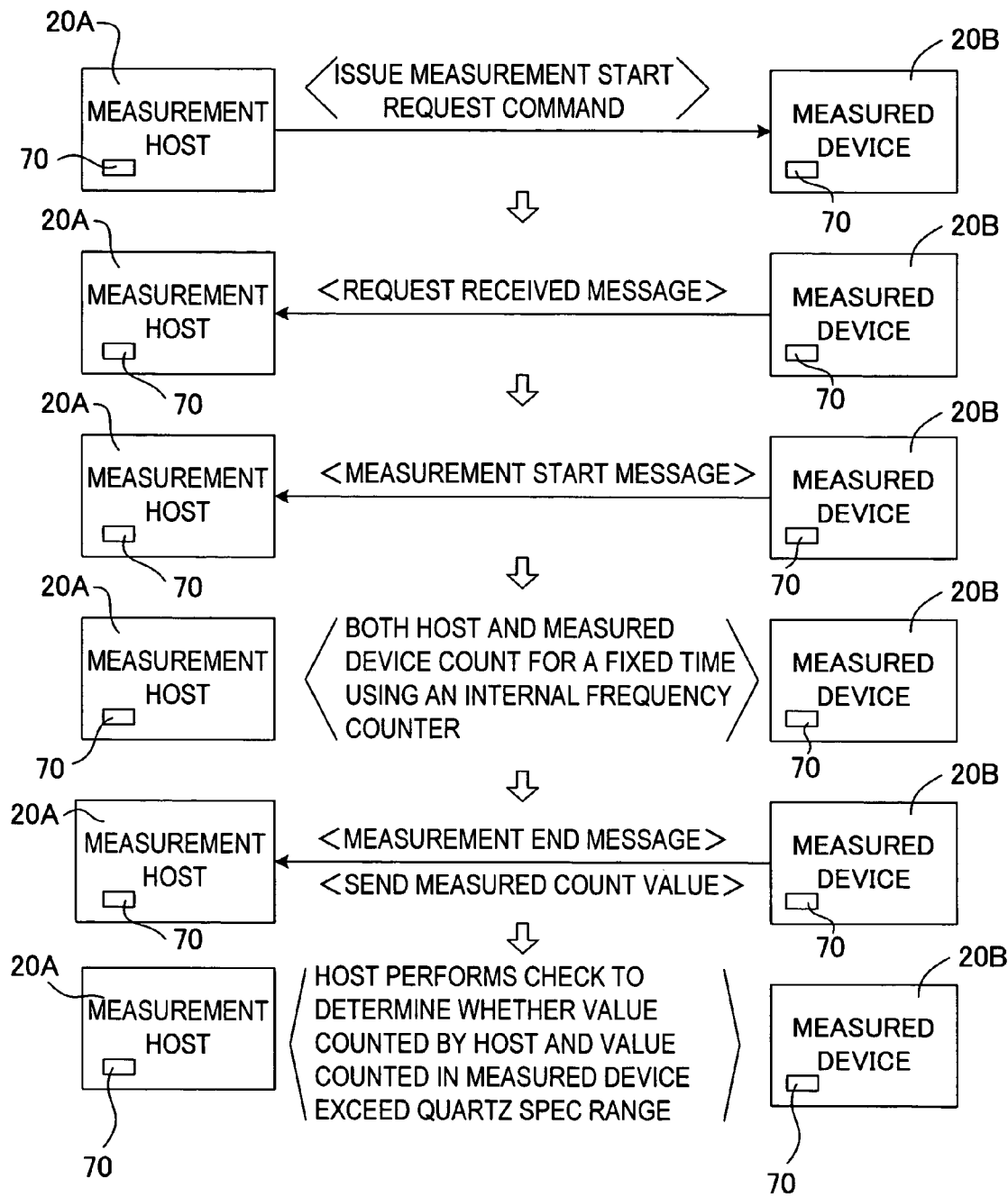
FIG. 3 explains a method of test of a clock source in a first embodiment of the invention.

FIG. 3 explains processing to inspect an interface clock generation circuit in a first embodiment of the invention.

First, a normal control print board (measurement host) 20A, which serves as a reference to indicate that the clock source 8 for measurement are normal and that no abnormalities are observed in various tests, is connected the control circuit board 20B to be measured to the above-described interface. Both control print boards 20A, 20B have the same configuration as that shown in FIG. 1 and FIG. 2. Below, the reference control print board 20A is called the first print board 20A, and the control print board 20B to be inspected is called the second print board 20B.

A command requesting the beginning of measurement is issued from the first control print board 20A to the second control print board 20B. The second control print board 20B receives the command via the interface circuit 60 described above, and the MPU 7 analyzes this command and responds to the first control print board 20A, via the interface circuit 60, with a request received message.

Then, the MPU 7 of the second control print board 20B transmits a measurement start message to the first control print board 20A via the interface circuit 60. The MPU 7 of the second control print board 20B sets the counter 70 in FIG. 2 to count-enabled, and the MPU 7 of the first control print board 20A sets the counter 70 of FIG. 2 to count-enabled.

By this means, the counters 70 on both the print boards 20A, 20B count the clock pulses of the fast clock sources 8.

Upon detecting that the count value of an internal counter, not shown, which counts the clock pulses of the slow clock source 9, has reached a fixed time, the MPUs 7 of the first and second print boards 20A, 20B halt counting operations by each of the counters 70.

Then, the MPU 7 of the second print board 20B transmits to the first control print board 20A, via the interface circuit 60, a measurement end message and the count value measured by the counter 70.

Upon receiving this, the MPU 7 of the first print board 20A compares the count value of the counter 70 of the first print board 20A with the measurement count value received from the second print board 20B, and checks whether the measurement count value exceeds the specification range for the fast clock source 8. That is, a judgment is made as to whether the deviation of the measurement count value from the reference count value of the first print board 20A exceeds the specification range.

This judgment result is displayed on a monitor connected to the first print board 20A, so that it is possible to determine, in a testing process, whether the fast clock source 8 on the second print board 20B is within the specification range. If the result exceeds the specification range, then the print board 20B is abnormal, the fast clock source 8 is replaced with another clock source, and measurements are again performed.

In this way, an interface clock source can be inspected while in the mounted state on a print board without using specialized tools or equipment, so that costs increases can be prevented even when all units are inspected; moreover, because a normal print board is connected, tests can be performed under circumstances of actual use.

Second Embodiment of a Method of Clock Generation Circuit Test

Figure 4:
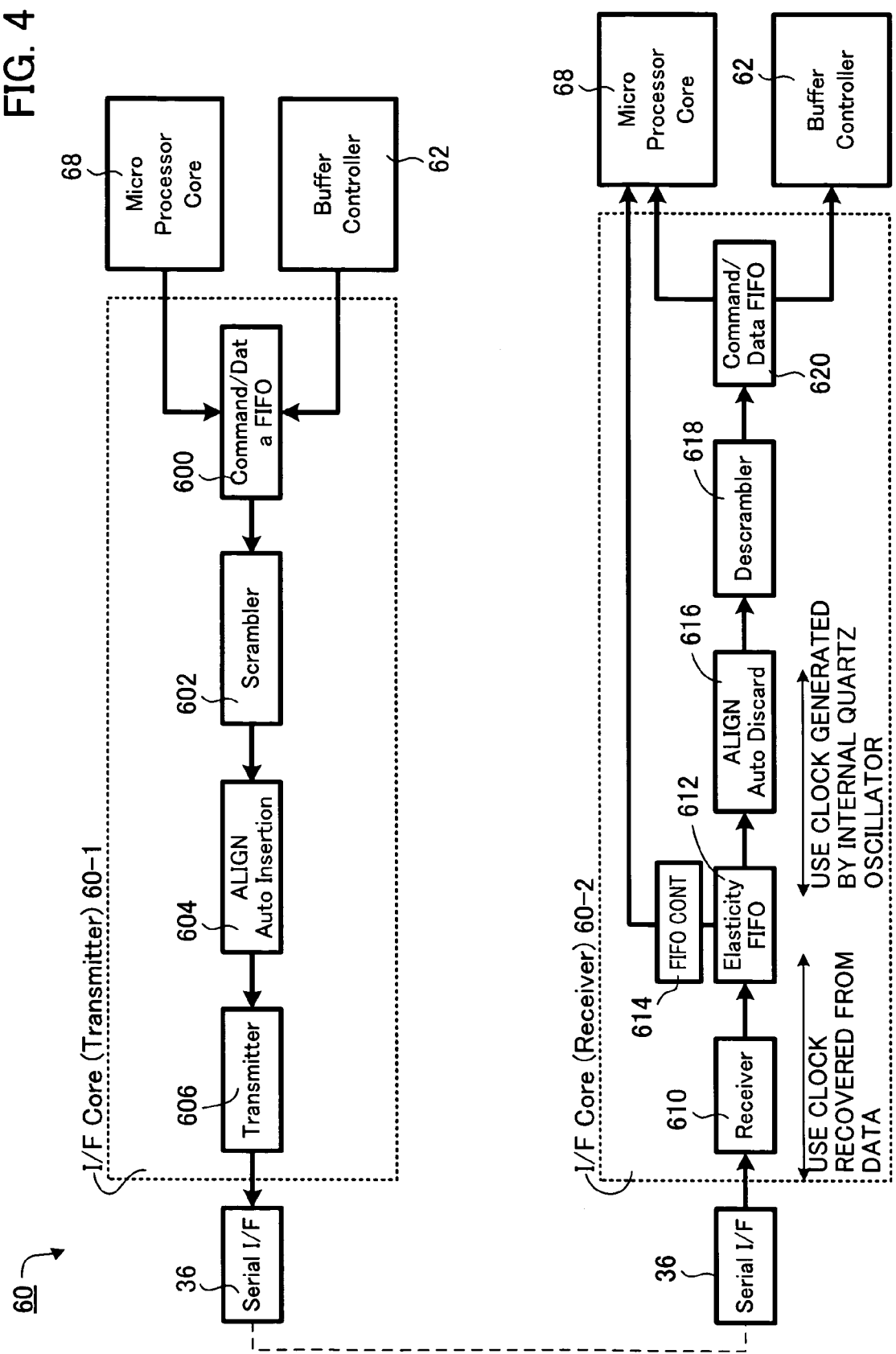
FIG. 4 shows the configuration of an interface circuit in a second embodiment of the invention.
Figure 5:
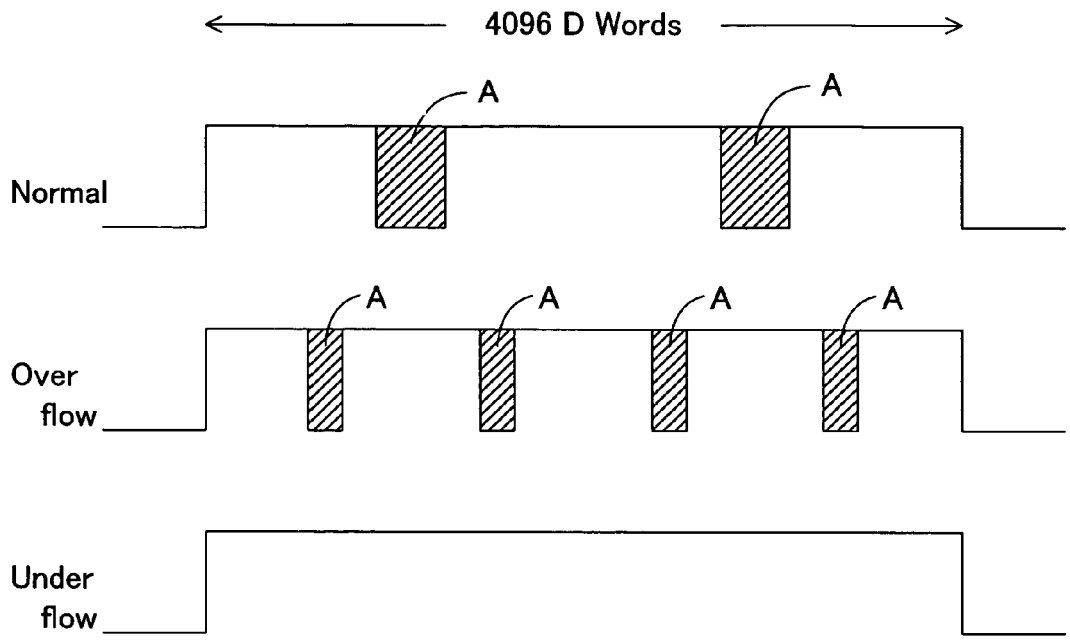
FIG. 5 explains the format of transferred data in the second embodiment of the invention.

FIG. 4 is a block diagram of the interface circuit 60 of FIG. 2, FIG. 5 explains the frame format of FIG. 4, and FIG. 6 through FIG. 8 explain operation of the FIFO circuit of FIG. 4.

In the serial system HDC 6, a buffer (FIFO) to absorb clock skew between the data/clock from outside and the internal clock is provided. In the serial interface (Fibre Channel or SAS/SATA), two ALIGNs are inserted at every 4096 DWORDs (double words), these ALIGNs are discarded in the buffer, and skew adjustment is performed. When frequency deviation of the fast clock source 8 occurs, depending on the nature of the deviation, the FIFO buffer may overflow.

Utilizing this function, the magnitude of the frequency deviation is investigated; the number of ALIGNs and FIFO size are stipulated to cause overflow of the FIFO buffer during use of a fast clock source with a frequency deviation of ±200 ppm or similar, the device for measurement is connected to a host, data is transmitted and received, and a measured device which results in overflow is rejected.

That is, as shown in FIG. 4, the interface circuit 6 has a transmission interface circuit 6-1 and a reception interface circuit 6-2. The transmission interface circuit 6-1 is connected to the microprocessor core 68 and buffer controller 62, and has a command/data FIFO buffer 600 which stores commands/data for transmission, a scramble circuit 602 which scrambles commands/data in the FIFO buffer 600, an align insertion circuit 604 which inserts aligns, and a transmission circuit 606.

Further, the reception interface circuit 6-2 has a reception circuit 610 which receives serial signals from the serial interface 36, a FIFO circuit 612 which stores commands/data received by the reception circuit 610, a FIFO controller 614 which controls the FIFO circuit 612, an align deletion circuit 616 which discards aligns, a descramble circuit 618 which descrambles commands/data which has been received and discarded, and a command/data FIFO circuit 620 which stores descrambled commands/data.

In this embodiment, alignment is used to detect deviation of the frequency by means of discard operations in the reception FIFO buffer 612. Alignment in this reception FIFO circuit 612 is explained. As shown in FIG. 5, the transmission-side align insertion circuit 604 inserts two align data items A in units of 4096 DWORDs, and on the receiving side skew correction is possible. In FIG. 5, this is indicated as "Normal".

Figure 6:
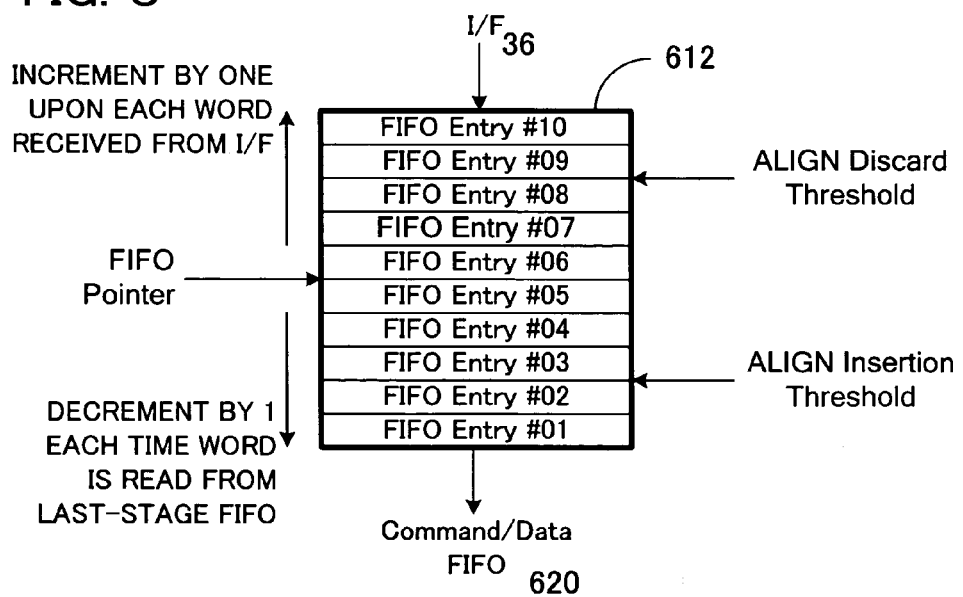
FIG. 6 explains normal operation of the FIFO buffer of FIG. 4.

On the other hand, as shown in FIG. 6, the reception FIFO buffer 612 is called an elastic FIFO, and is controlled by a FIFO pointer of the control circuit 614. The FIFO pointer is incremented by one for each word received from the interface 36 to the FIFO buffer 612, and is decremented by one for each word read to the later-stage FIFO buffer 620.

Here, the input to the FIFO buffer 612 is synchronized with the clock recovered from the data, and output from the FIFO buffer 612 operates in synchronous with the internal clock (that is, according to the fast clock of the clock source 8).

The FIFO control circuit 614 discards the next ALIGN detected from the reception FIFO 612 when the FIFO pointer exceeds the align discard threshold (called overflow), and when the FIFO pointer is equal to or less than the align insertion threshold (called underflow) an ALIGN is added to the FIFO buffer 612 and the FIFO pointer is incremented by one.

Hence when the normal 4096 DWORDs of data are transmitted as indicated by "Normal" in FIG. 5, the frequency of the recovered clock described above is the same as the frequency of the internal clock, so that as shown in FIG. 6, the FIFO pointer does not exceed the align deletion threshold and is not equal to or less than the align insertion threshold, and neither overflow nor underflow occurs.

Utilizing this function, the align insertion interval and threshold values are modified at the time of measurement to force overflow/underflow of the FIFO buffer 612. By this means, deviation of the frequency is detected.

Four ALIGNs are inserted at fixed intervals in 4096 DWORDs of data, as indicated by "Overflow" in FIG. 5, and the data is transmitted. As shown in FIG. 6, when the frequency of the above-described recovered clock is the same as the frequency of the internal clock, the FIFO pointer does not exceed the align deletion threshold, and does not become equal to or less than the align insertion threshold, so that neither overflow nor underflow occur.

If on the other hand the frequency of the above-described internal clock is lower than the frequency of the recovered clock, then the FIFO pointer is successively incremented as indicated in FIG. 7, the align deletion threshold is exceeded, and ALIGNs are discarded. That is, when there is a frequency deviation, overflow occurs. Overflow indicates that the frequency of the internal clock (the clock of the fast clock source) is lower than the recovered clock frequency by a greater amount than is allowed by the specifications.

On the other hand, no ALIGNs at all may be inserted in 4096 DWORDs of data, as indicated by "Underflow" in FIG. 5. As shown in FIG. 6, when the above-described recovered clock frequency is the same as the internal clock frequency, the FIFO pointer does not exceed the align deletion threshold and does not become equal to or less than the align insertion threshold, and neither overflow nor underflow occurs.

Figure 8:
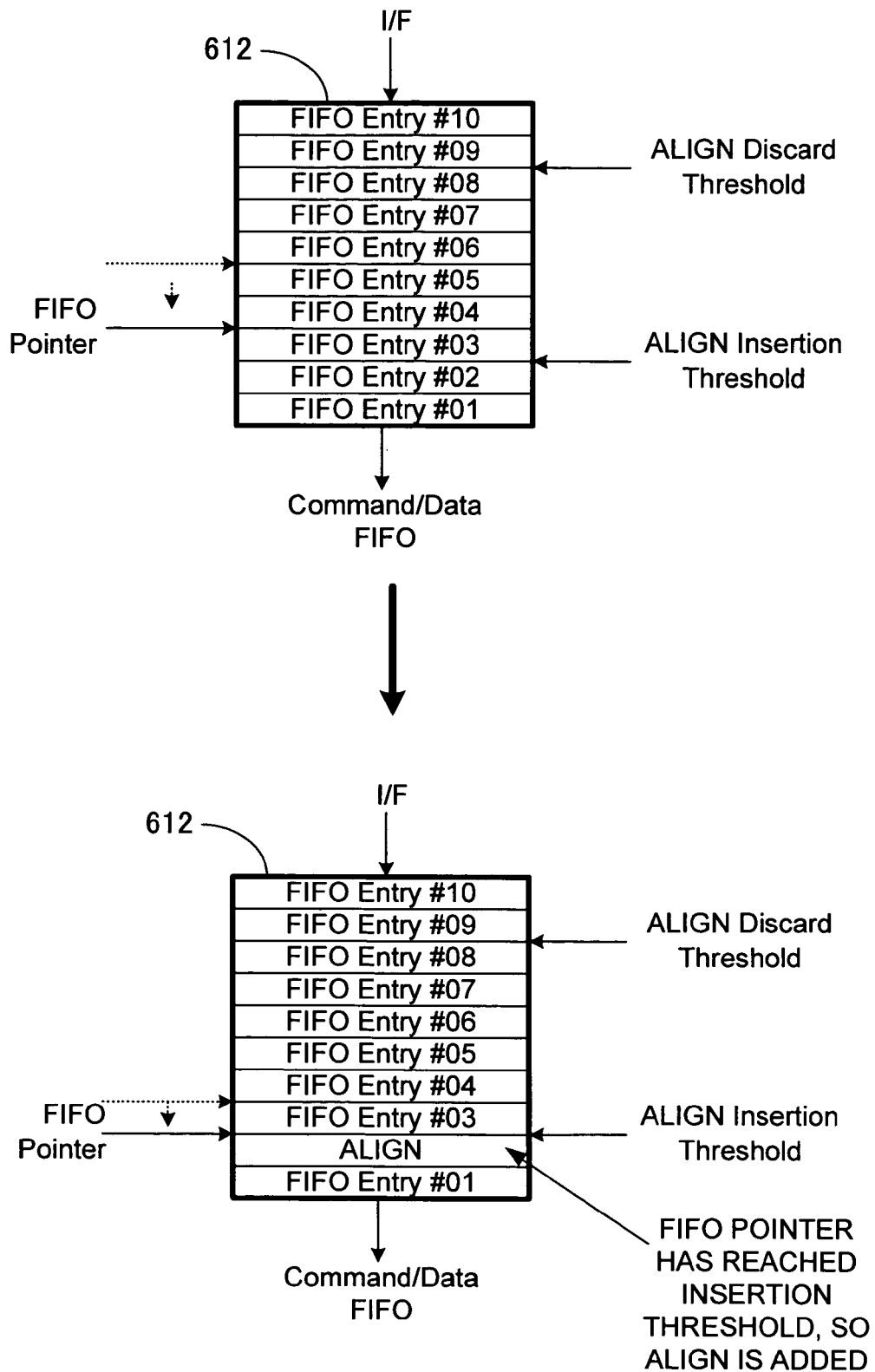
FIG. 8 explains operation during underflow of the FIFO buffer of FIG. 4.

If on the other hand the frequency of the above-described internal clock is higher than the frequency of the recovered clock, then the FIFO pointer is successively decremented as indicated in FIG. 8, becoming equal to or less than the align deletion threshold, so that ALIGNs are inserted. That is, when there is a frequency deviation, underflow occurs. Underflow indicates that the frequency of the internal clock (the clock of the fast clock source) is higher than the recovered clock frequency by a greater amount than is allowed by the specifications.

That is, similarly to FIG. 3, the print board for measurement 20B is connected to the reference print board 20A, and overflow data and underflow data are transmitted from the reference print board 20A to the print board for measurement 20B, as shown in FIG. 5. And the control circuit 614 notifies the microprocessor core 68 of operations for align insertion and align deletion in the reception FIFO buffer 612.

In this way, it is possible to determine, in a testing process, whether the fast clock source 8 on the second print board 20B is within the specification range. If the result exceeds the specification range, then the print board 20B is abnormal, the fast clock source 8 is replaced with another clock source, and measurements are again performed.

In this way, an interface clock source can be inspected while in the mounted state on a print board without using specialized tools or equipment, so that costs increases can be prevented even when all units are inspected; moreover, because a normal print board is connected, tests can be performed under circumstances of actual use.

Compared with the first embodiment, special commands are not required, and it is nor necessary to require processing to accommodate commands of the measured device. Further, as explained above, overflow and underflow are detected in terms of the FIFO pointer and thresholds to perform a test ensuring that the clock source 8 is within the specification range, and so similar tests can be performed even when these thresholds are modified.

Third Embodiment of a Method of Clock Generation Circuit Test

Figure 9:
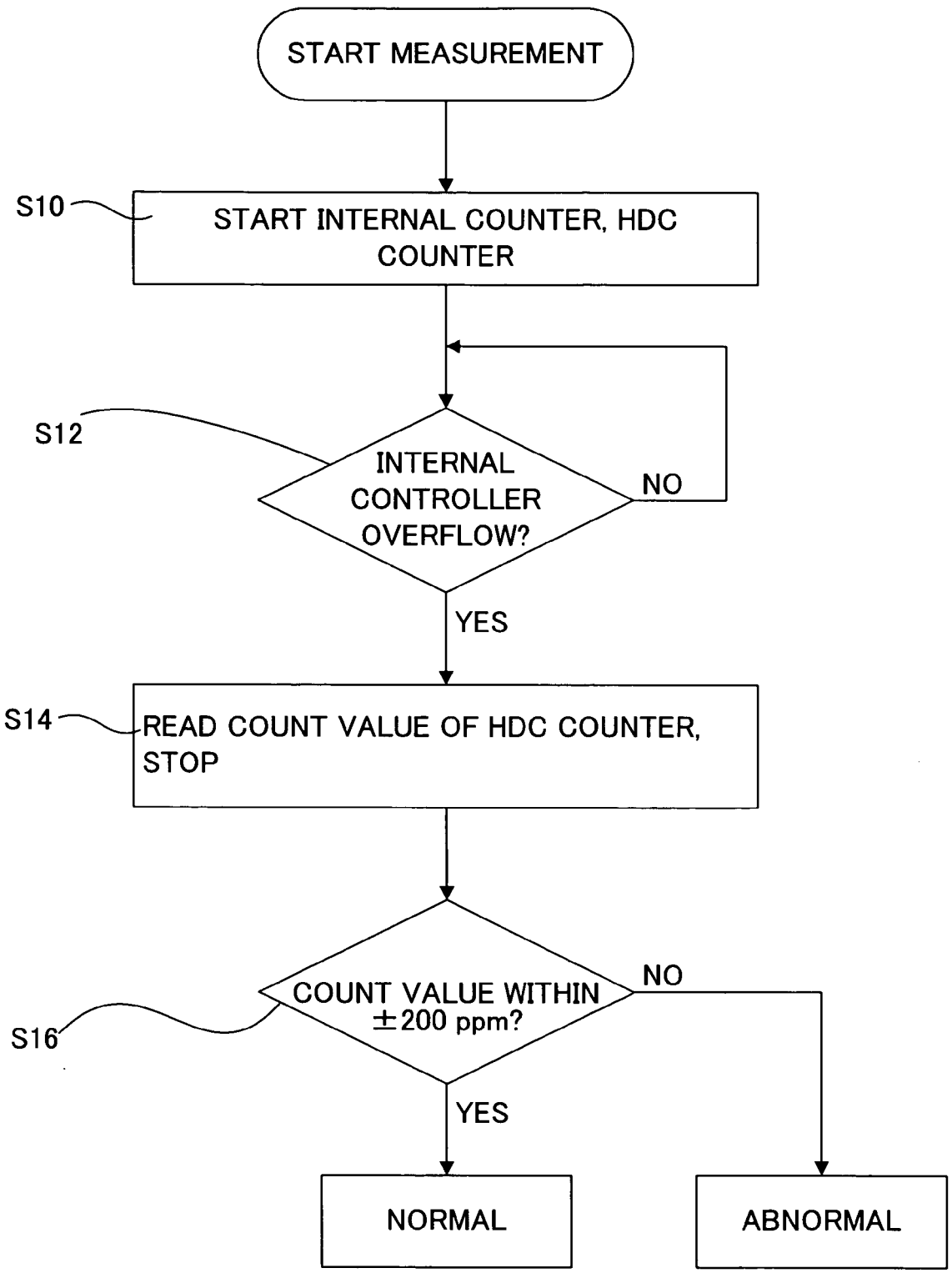
FIG. 9 is a diagram of the flow of clock source test processing in a third embodiment of the invention.

FIG. 9 shows the flow of processing to inspect an interface clock generation circuit in a third embodiment of the invention. In the method of this processing, a reference clock (clock of a slow clock source 9) within the device for measurement is used, so that a host is unnecessary, and the device can perform the test itself. The processing of FIG. 9 is explained referring to FIG. 1 and FIG. 2.

(S10) The MPU 7 starts an internal counter (not shown) which operates using the clock of the slow clock source 9 and the counter 70 within the HDC 6 which counts the clock pulses of the fast clock source 8.

(S12) The MPU 7 judges whether the internal counter has overflowed or not.

(S14) If the internal counter overflows, the MPU 7 judges that a fixed time has elapsed, stops counting by the counter 70 in the HDC 6, and reads the count value.

(S16) The MPU 7 checks whether the count value is within a range of ±200 ppm of the stipulated value. If the value is within this range, the MPU 7 judges operation to be normal, and if outside the range, judges operation to be abnormal.

In this way, the slow clock source 9 (for example, at 40 MHz) for the system clock, used by the controller in the device for measurement, is employed, and counting is started simultaneously by the counter 70 using the fast clock source 8 and the controller using the slow clock source. The frequencies are both investigated after counting has been performed for a fixed time, frequency deviation is checked, and if necessary the unit is rejected or similar.

This method initially requires special booting and similar, but does not require a host, and so can be realized extremely simply. Moreover, in addition to being executable in a process prior to shipment, the calibration function can be used in measurements even after shipment. That is, a SMART (Self Monitoring and Analysis Report Technology) function which can be used after shipment is added. The frequency is checked periodically, and when signs of degradation are observed, the host is notified. By this means, high product quality can be maintained even after shipment. As causes of degradation, degradation of the oscillator circuit in the quartz oscillator is conceivable.

Other Embodiments

In the above embodiments, the control print board of a magnetic disk device was used as an example of an electronic device; but application to the print boards or similar of electronic devices comprising other fast interfaces is also possible. The serial interface is not limited to that of the above embodiments, and application to other devices is possible. Further, in the first and second embodiments also, by providing diagnostic functions having the above-described test functions in the electronic circuitry of the print board, tests after product shipment are similarly possible.

In the above, embodiments of the invention have been explained; but this invention can be modified variously within the scope of the invention, and these modifications are not excluded from the scope of the invention.

A fast clock is counted in synchronization with an electronic device serving as reference, and the result is checked; or, alignment of transferred data and FIFO buffer overflow/underflow are utilized; or, the count values of an internal counter and of a counter of the fast clock are used, to check for frequency deviation of the fast clock source. As a result, test of the clock sources in all units is possible in the mounted state in the devices, so that cost increases incurred when the manufacturer inspects all units, and the increased costs associated with introduction of new equipment, can be prevented, and quality is enhanced.

What is claimed is:

1. A method of testing a clock generation circuit in an electronic device having an interface circuit which operates using a clock of a comparatively fast clock source, comprising the steps of:

connecting an electronic device to be measured to an electronic device which serves as reference using the interface circuit, synchronizing the electronic device to be measured with the reference electronic device, and counting clock pulses of the clock source in use of counters in the electronic device to be measured and in the reference electronic device;

halting, after a prescribed time has elapsed, the counting by the counters of the electronic device to be measured and of the reference electronic device;

transmitting the count value of the counter of the electronic device to be measured from the electronic device to be measured to the reference electronic device; and comparing the transmitted count value with the count value of the counter of the reference electronic device in the reference electronic device, and inspecting for deviations in the frequency of the clock source in the electronic device to be measured.

2. The method of testing a clock generation circuit in an electronic device according to claim 1, wherein the counting step comprises:

a step of transmitting a measurement start message from the reference electronic device to the electronic device to be measured;

a step of responding from the electronic device to be measured to the reference electronic device with a measurement start message; and a step of counting the clock pulses of the clock source in use of counters in the electronic device to be measured and in the reference electronic device.

3. A method of testing a clock generation circuit in an electronic device having an interface circuit which operates using a clock of a comparatively fast clock source, comprising the steps of:

receiving transferred data into which is inserted alignment data in prescribed transfer units from an electronic device connected by the interface circuit;

storing the received transferred data in a FIFO buffer using a clock synchronized with the transfer, and performing output using the clock of the clock source, as well as performing insertion and deletion of the alignment data in the FIFO buffer to prevent overflow and underflow of the FIFO buffer;

modifying the alignment insertion interval in the transferred data or the conditions for detection of the overflow or the underflow, judging whether the overflow or the underflow is detected; and inspecting for deviation in the frequency of the clock source of the electronic device from the judgment.

4. The method of testing a clock generation circuit in an electronic device according to claim 3, wherein the modifying step comprises:

a step of comparing the FIFO pointer of the FIFO buffer with a prescribed threshold; and a step of judging whether the overflow or the underflow has been detected.

5. A method of testing a clock generation circuit in an electronic device having an interface circuit which operates using a clock of a comparatively fast clock source, comprising the steps of:

starting, in use of an internal circuit which operates using a comparatively slow clock source, counting by a counter which counts clock pulses of the comparatively fast clock source and counting by an internal counter which counts the clock pulses of the comparatively slow clock source;

detecting that the internal counter has reached a prescribed value, and of reading and outputting the count value of the counter; and inspecting, in use of the count value, for frequency deviation of the comparatively fast clock source of the electronic device.

6. The method of testing a clock generation circuit in an electronic device according to claim 5, wherein the inspecting step comprises a step of judging whether the count value is within a specified range corresponding to a prescribed frequency deviation.

7. An electronic device, comprising:

a comparatively fast first clock source;

an interface circuit which operates using the clock of the first clock source;

a comparatively slow second clock source; and an internal circuit, connected to the interface circuit, which operates using the clock of the second clock source, wherein the internal circuit uses a counter to count the clock pulses of the first clock source in synchronization with an electronic device which is connected to the interface circuit and which serves as reference, transmits the count value of the counter to the reference electronic device after a prescribed amount of time has elapsed to inspect for frequency deviation of the first clock source in the reference electronic device.

8. The electronic device according to claim 7, wherein the internal circuit receives a measurement start message transmitted from the reference electronic device, responds with a measurement start message to the reference electronic device, and counts in use of the counter the clock pulses of the first clock source.

9. The electronic device according to claim 7, wherein the internal circuit comprises a disk drive control circuit.

10. An electronic device, comprising:

a comparatively fast first clock source;

an interface circuit which operates using the clock of the first clock source;

a comparatively slow second clock source; and an internal circuit, connected to the interface circuit, which operates using the clock of the second clock source, wherein the interface circuit comprises:

a reception circuit which receives transfer data into which alignment data has been inserted in prescribed transfer units;

a FIFO buffer which stores the received transfer data using the clock synchronized with the transfer and outputs the data with the clock of the clock source; and a FIFO control circuit which performs insertion and deletion of alignment data into and from the FIFO buffer to prevent FIFO buffer overflow and underflow, and wherein the internal circuit receives the transfer data with the interval of alignment data insertion changed, or changes the detection conditions of overflow or underflow, judges whether the overflow or the underflow has been detected, and inspects for frequency deviation of the first clock source.

11. The electronic device according to claim 10, wherein the FIFO control circuit compares a FIFO pointer of the FIFO buffer with a prescribed threshold, and outputs information indicating whether the overflow or the underflow has been detected.

12. The electronic device according to claim 10, wherein the internal circuit comprises a disk drive control circuit.

13. An electronic device, comprising:

a comparatively fast first clock source;

an interface circuit which operates using the clock of the first clock source and having a counter which counts the clock pulses of the first clock source;

a comparatively slow second clock source; and an internal circuit which is connected to the interface circuit and which operates in use of the clock of the second clock source, wherein the internal circuit starts counting by the counter and by an internal counter which counts the clock pulses of the second clock source, detects the fact that the internal counter has reached a prescribed value, reads the count value of the counter, and uses the count value to inspect for frequency deviation of the first clock source.

14. The electronic device according to claim 13, wherein an internal circuit judges whether the count value is within a stipulated range corresponding to a prescribed frequency deviation.

15. The electronic device according to claim 13, wherein the internal circuit comprises a disk drive control circuit.

16. The electronic device according to claim 13, wherein the internal circuit has a processor.

* * * * *